(12) United States Patent
Hao et al.

(10) Patent No.: US 9,190,170 B1
(45) Date of Patent: Nov. 17, 2015

(54) SHIFT REGISTER UNIT, GATE DRIVING DEVICE, DISPLAY PANEL AND DISPLAY DEVICE

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventors: Xueguang Hao, Beijing (CN); Xiangdong Wei, Beijing (CN); Bongyeol Ryu, Beijing (CN); Seongjun An, Beijing (CN)

(73) Assignees: BOE TECHNOLOGY GROUP CO., LTD, Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 0 days.

(21) Appl. No.: 14/525,160

(22) Filed: Oct. 27, 2014

(30) Foreign Application Priority Data

Jun. 18, 2014 (CN) .......................... 2014 1 0273161

(51) Int. Cl.
*G11C 19/28* (2006.01)
*G09G 3/36* (2006.01)
*G06T 5/00* (2006.01)
*G11C 19/18* (2006.01)

(52) U.S. Cl.
CPC .............. *G11C 19/28* (2013.01); *G06T 5/002* (2013.01); *G09G 3/3674* (2013.01); *G09G 3/3677* (2013.01); *G09G 3/3696* (2013.01); *G11C 19/184* (2013.01); *G09G 2310/0286* (2013.01)

(58) Field of Classification Search
CPC .............. G11C 19/18–19/184; G09G 3/2674; G09G 2310/0286
See application file for complete search history.

(56) References Cited

U.S. PATENT DOCUMENTS

| | | | | |
|---|---|---|---|---|
| 8,130,189 B2 * | 3/2012 | Xu | .................. | G09G 3/3677 345/100 |
| 8,199,870 B2 * | 6/2012 | Shang | .................. | G11C 19/184 377/64 |
| 8,269,714 B2 * | 9/2012 | Furuta | .................. | G11C 19/184 345/100 |
| 8,964,932 B2 * | 2/2015 | Wu | .................. | G09G 3/3266 377/64 |
| 9,064,592 B2 * | 6/2015 | Shang | .................. | G09G 3/20 |
| 2014/0098015 A1 * | 4/2014 | Wang | .................. | G09G 3/3677 345/100 |
| 2014/0192039 A1 * | 7/2014 | Wang | .................. | G11C 19/28 345/213 |
| 2015/0248940 A1 * | 9/2015 | Yang | .................. | G09G 3/3677 377/64 |

* cited by examiner

*Primary Examiner* — Patrick O'Neill
(74) *Attorney, Agent, or Firm* — Blakely Sokoloff Taylor & Zafman LLP

(57) ABSTRACT

The embodiments of the present invention provide a shift register unit, a gate driving device, a display panel and a display device for solving the problem of relatively large noise in the signal outputted by the shift register unit within non-working time when the clock signal is of high level. Within the non-working time of the shift register unit, i.e., when displaying a frame of images, in periods of time other than the period of time when the scan trigger signal is of high level and the period of time when the output end of the shift register unit is of high level, the first pull-down drive module can connect the output end of the shift register unit with a low level signal end when the received clock signal is of high level, or when the received clock signal is of low level and the output end of the shift register unit is of low level, thereby releasing the noise coupled to the output end of the shift register unit by the high level signal to the low level signal end, so as to reduce the noise in the signal outputted by the shift register unit in the non-working time.

16 Claims, 13 Drawing Sheets

SHIFT REGISTER UNIT, GATE DRIVING DEVICE, DISPLAY PANEL AND DISPLAY DEVICE

RELATED APPLICATIONS

The present application claims the benefit of Chinese Patent Application No. 201410273161.8, filed Jun. 18, 2014, the entire disclosure of which is incorporated herein by reference.

FIELD OF THE INVENTION

The present invention relates to the field of display technology, particularly to a shift register unit, a gate driving device, a display panel and a display device.

BACKGROUND OF THE INVENTION

The liquid crystal display panel is formed by a two dimensional liquid crystal pixel matrix; the driving device of the liquid crystal display panel comprises a gate driving device and a data driving device. The data driving device latches the inputted display data in order and converts them into analog signals, the data lines of the liquid crystal display panel are scanned sequentially; the gate driving device comprises several shift register units, the signal at the control signal output end of each stage of shift register unit will be transmitted to the reset signal input end of its previous stage of shift register unit and the control signal input end of its next stage of shift register unit. Each stage of shift register unit converts the inputted clock signal into an open signal or a close signal, which is outputted from its control signal output end to a gate line corresponding to it.

The typical structure in the existing shift register unit is as shown in FIG. 1, FIG. 2 is a working sequence diagram of the shift register unit as shown in FIG. 1. Its working principle is as follows:

In the first phase, the control signal input end INPUT is of high potential, the reset signal input end RESETIN is of low potential, the transistor T103 is turned on, the transistor T101, the transistor T102, and the transistor T104 are cut-off, the capacitor C102 is charged through the transistor T103, hence, the connection point P is of high potential;

In the second phase, the control signal input end INPUT is of low potential, the reset signal input end RESETIN is of low potential, the clock signal input end CLKIN is of high potential, the transistor T101 is turned on, hence, the control signal output end OUTPUT outputs a high level signal; since the transistor T102, the transistor T103, and the transistor T104 are cut-off, the connection point P is floating here, the control signal output end OUTPUT is of high potential, and is coupled to the connection point P through the capacitor C102, so the potential at the connection point P continues to rise on the basis of the first phase;

In the third phase, the control signal input end INPUT is of low potential, the reset signal input end RESETIN inputs a high level signal, the transistors T102 and T104 are turned on, the transistor T101 and the transistor T103 are cut-off, the capacitor C102 is discharged, the connection point P is of low potential, since the source of T102 is connected with the low voltage signal input VSSIN, the control signal output end OUTPUT is of low potential;

In the fourth phase, the control signal input end INPUT is of low potential, the reset signal input end RESETIN is of low potential, hence, the transistor T101, the transistor T102, the transistor T103 and the transistor T104 are all cut-off, the signal outputted by the control signal output end OUTPUT remains at a low potential;

In the fifth phase, the signal inputted by the control signal input end INPUT is of low potential, the reset signal input end RESETIN is of low potential, the transistor T101, the transistor T102, the transistor T103 and the transistor T104 remain in the state of the fourth stage, hence, the control signal output end OUTPUT is still of low potential.

In these five phases: in the first phase, control signal input end INPUT is inputted a high level signal; in the second phase, control signal output end OUTPUT outputs a high level signal, thus a shift is completed; in the third phase, reset signal input end RESETIN is inputted a high level signal to complete the reset operation; hence, the first, second and third phases can be defined as the working time of the shift register unit, the fourth and the fifth phases can be defined as the non-working time of the shift register unit.

It can be seen that in the non-working time, the control signal input end INPUT, the reset signal input end RESETIN and the control signal output end OUTPUT are all of low level; when the clock signal input end CLKIN is of high potential, it will be coupled to the connection point P through a parasitic capacitance between the gate and the drain of the transistor T101, such that the leakage current of the transistor T101 is increased, which results in rising of the potential of the control signal output end OUTPUT; moreover, since the transistor T103, the transistor T104 and the transistor T102 are all cut-off in the non-working time, the voltage of the control signal output end OUTPUT cannot be reduced, thereby enabling the output signal of the control signal output end OUTPUT to produce a relatively large coupled noise.

To sum up, in the non-working time of the existing shift register unit, when the received clock signal is of high level, the high level signal will be coupled to the output end of the shift register unit through a parasitic capacitance on the transistor, while the output end is in a floating state in the non-working time, such that the noise coupled to the output end of the shift register unit by the high level signal cannot be eliminated, and the noise will be outputted together with the signal of the output end of the shift register unit, which results in relatively large noise in the signal outputted by the shift register unit.

SUMMARY OF THE INVENTION

The embodiments of the present invention provide a shift register unit, a gate driving device, a display panel and a display device for solving the problem of relatively large noise in the signal outputted by the shift register unit because in the non-working time of the existing shift register unit, the noise coupled to the output end of the shift register unit cannot be eliminated when the clock signal is of high level.

Based on the above problem, a shift register unit provided by an embodiment of the present invention comprises at least a pull-up drive module, a first pull-down drive module, a second pull-down drive module and an output module:

the pull-up drive module is used for outputting a received high level signal to the output module when a received scan trigger signal is of high level;

the output module is used for receiving and storing the signal outputted by the pull-up drive module, and outputting a received clock blocking signal through the output end of the shift register unit when the stored signal is of high level; when the scan trigger signal is of high level, the clock blocking signal is of low level;

the first pull-down drive module is used for connecting the output end of the shift register unit with a low level signal end when the received clock signal is of high level, or when the received clock signal is of low level, and the output end of the shift register unit is of low level; and disconnecting the output end of the shift register unit from the low level signal end when the output end of the shift register unit is of high level; the clock signal is contrary to the clock blocking signal;

the second pull-down drive module is used for outputting a low level signal to the output module when a received enable signal is of high level so as to set the signal stored by the output module to be of low level; when displaying a frame of images, the enable signal is of high level in periods of time other than the period of time when the scan trigger signal is of high level and the period of time when the output end of the shift register unit is of high level.

A gate driving device provided by an embodiment of the present invention comprises multiple stages of shift register unit provided by the embodiment of the present invention; except for the first stage of shift register unit, each stage of shift register unit receives a signal outputted by a previous stage of shift register unit of itself as a scan trigger signal; the first stage of shift register unit receives an initial trigger signal as a scan trigger signal.

A gate drive device provided by an embodiment of the present invention comprises multiple stages of shift register unit provided by the embodiment of the present invention; except for the first stage of shift register unit and the last stage of shift register unit, each stage of shift register unit receives a signal outputted by a previous stage of shift register unit of itself as a forward scan trigger signal, and receives a signal outputted by a next stage of shift register unit of itself as a backward scan trigger signal; the first stage of shift register unit receives a first initial trigger signal as a forward scan trigger signal, and receives a signal outputted by a second stage of shift register unit as the backward scan trigger signal; the last stage of shift register unit receives a second initial trigger signal as the backward scan trigger signal, the last stage of shift register unit receives a signal outputted by a previous stage of shift register unit of itself as the forward scan trigger signal.

A display panel provided by an embodiment of the present invention comprises a gate driving device provided by the embodiment of the present invention.

A display device provided by an embodiment of the present invention comprises a gate driving device provided by the embodiment of the present invention.

The beneficial effects of the embodiments of the present invention comprise:

The embodiments of the present invention provide a shift register unit, a gate driving device, a display panel and a display device, in the non-working time of the shift register unit, i.e., when displaying a frame of images, in the periods of time other than the period of time when the scan trigger signal is of high level and the output end of the shift register unit is of high level, the first pull-down drive module can connect the output end of the shift register unit with a low level signal end when the received clock signal is of high level, or when the received clock signal is of low level and the output end of the shift register unit is of low level, thereby releasing the noise coupled to the output end of the shift register unit by the high level signal to the low level signal end, so as to reduce the noise in the signal outputted by the shift register unit in the non-working time.

DETAILED DESCRIPTION OF THE INVENTION

The embodiments of the present invention provide a shift register unit, a gate driving device, a display panel and a display device, in the non-working time of the shift register unit, the first pull-down drive module can connect the output end of the shift register unit with a low level signal end when the received clock signal is of high level, or when the received clock signal is of low level and the output end of the shift register unit is of low level, thereby releasing the noise coupled to the output end of the shift register unit by the high level signal to the low level signal end, so as to reduce the noise in the signal outputted by the shift register unit in the non-working time.

The shift register unit, the gate driving device, the display panel and the display device provided by the embodiments of the present invention will be explained specifically in conjunction with the drawings of the description in the following.

Figure 1:
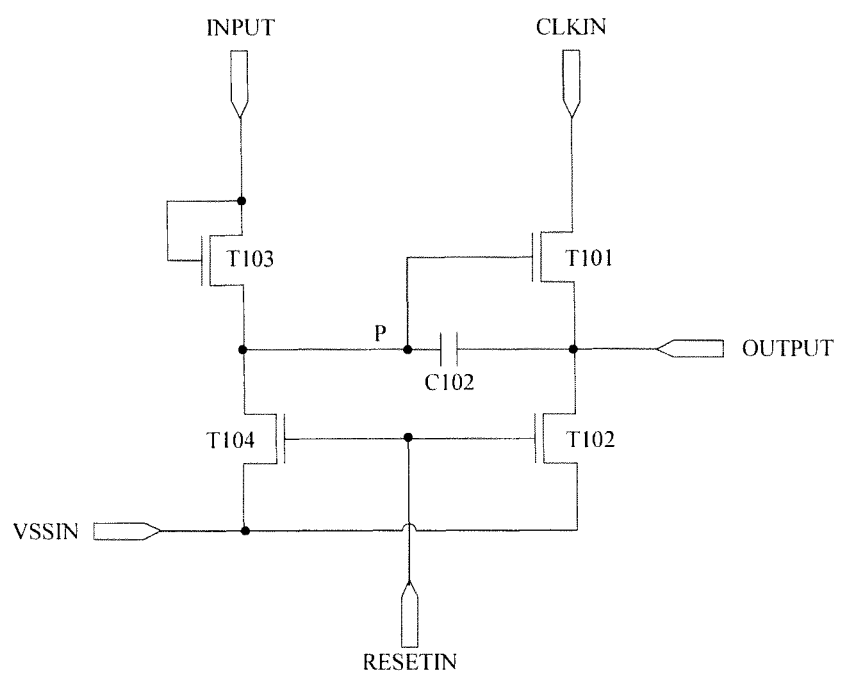
FIG. 1 is a structural schematic view of a shift register unit in the prior art.
Figure 2:
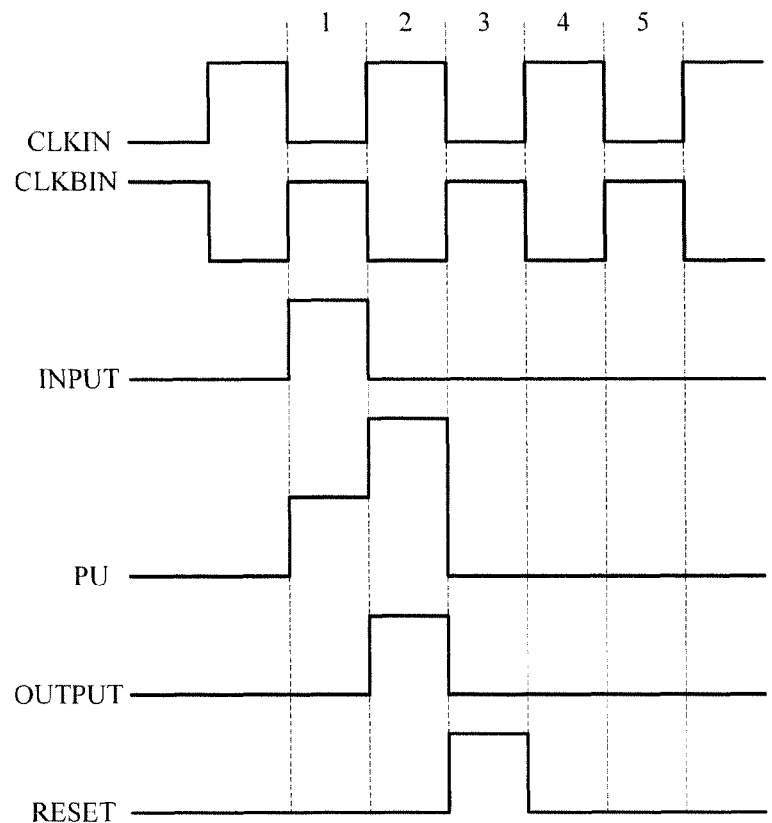
FIG. 2 is a sequence diagram when the shift register unit as shown in FIG. 1 is working.
Figure 3:
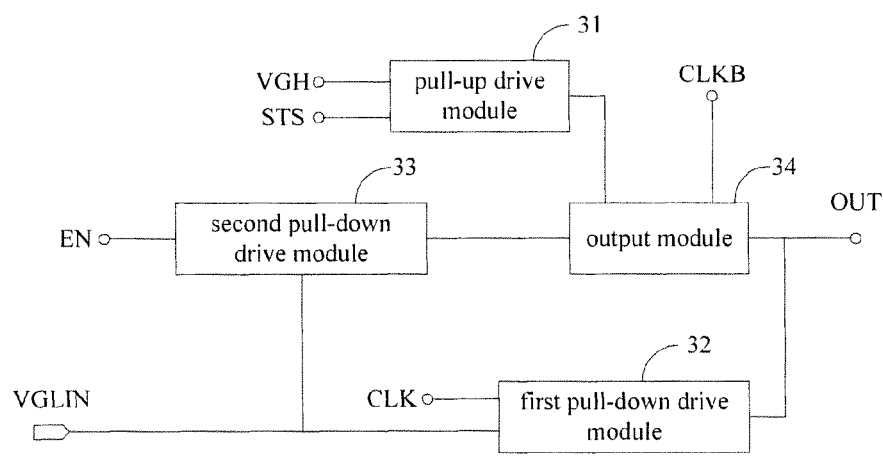
FIG. 3 is a structural schematic view of a shift register unit provided by Embodiment One of the present invention.

The shift register unit provided by Embodiment One of the present invention may adopt the circuit structure as shown in FIG. 3; the structure as shown in FIG. 3 comprises a pull-up drive module 31, a first pull-down drive module 32, a second pull-down drive module 33 and an output module 34:

the pull-up drive module 31 is used for outputting a received high level signal to the output module 34 when a received scan trigger signal STS is of high level;

the output module 34 is used for receiving and storing the signal outputted by the pull-up drive module 31, and outputting a received clock blocking signal CLKB through the output end OUT of the shift register unit when the stored signal is of high level; when the scan trigger signal STS is of high level, the clock blocking signal CLKB is of low level;

the first pull-down drive module 32 is used for connecting the output end OUT of the shift register unit with a low level signal end VGLIN when the received clock signal CLK is of high level; and connecting the output end OUT of the shift register unit with a low level signal end VGLIN when the received clock signal CLK is of low level, and the output end OUT of the shift register unit is of low level; and disconnecting the output end OUT of the shift register unit from the low level signal end VGLIN when the output end OUT of the shift register unit is of high level; the clock signal CLK is contrary to the clock blocking signal CLKB, i.e., when the clock signal CLK is of high level, the clock blocking signal CLKB is of low level, when the clock signal CLK is of low level, the clock blocking signal CLKB is of high level;

the second pull-down drive module 33 is used for outputting a low level signal VGL to the output module 34 when a received enable signal EN is of high level so as to set the signal stored by the output module 34 to be of low level; when displaying a frame of images, the enable signal EN is of high level in periods of time other than the period of time when the scan trigger signal STS is of high level and the period of time when the output end OUT of the shift register unit is of high level.

The shift register unit provided by the embodiment of the present invention can output the received clock blocking signal CLKB in the period of time when the scan trigger signal EN is of high level and in the period of time when the output end OUT of the shift register unit is of high level, i.e., in the period of time when the signal stored by the output module 34 is of high level (namely the working time of the shift register unit); moreover, when the output end OUT of the shift register unit is of high level, the first pull-down drive module 32 can disconnect the output end OUT of the shift register unit from the low level signal end VGLIN; furthermore, in the non-working time of the shift register unit, i.e., when displaying a frame of images, in periods of time other than the period of time when the scan trigger signal is of high level and the period of time when the output end of the shift register unit is of high level, the second pull-down drive module 33 can connect the output end OUT of the shift register unit with a low level signal end VGLIN, thereby setting the signal stored by the output module 34 as a low level, such that the output module 34 will not output the received clock blocking signal CLKB any more. Therefore, the shift register unit can achieve the function of scanning the gate lines one by one (the output end OUT of each shift register unit is connected with a different gate line respectively).

Moreover, in the non-working time of the shift register unit, the first pull-down drive module 32 can connect the output end OUT of the shift register unit with a low level signal end VGLIN when the received clock signal CLK is of high level, and connect the output end OUT of the shift register unit with the low level signal end VGLIN when the received clock signal CLK is of low level and the output end OUT of the shift register unit is of low level, thereby releasing the noise coupled to the output end OUT of the shift register unit by the high level signal to the low level signal end VGLIN, so as to reduce the noise in the signal outputted by the shift register unit in the non-working time. Wherein the low level signal end VGLIN outputs a low level signal VGL.

Figure 4:
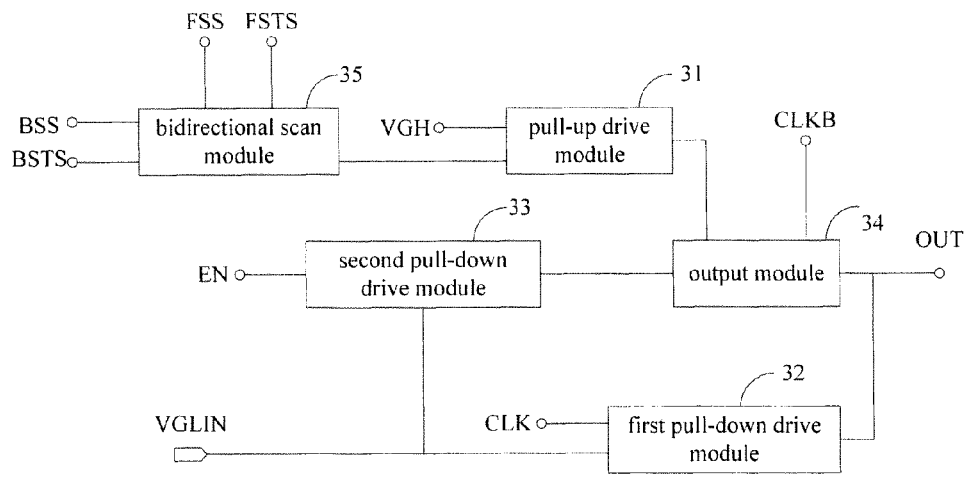
FIG. 4 is a structural schematic view of a shift register unit provided by Embodiment Two of the present invention.

Preferably, the shift register unit provided by Embodiment Two of the present invention may adopt the circuit structure as shown in FIG. 4. Compared with the shift register unit as shown in FIG. 3, the shift register unit as shown in FIG. 4 further comprises a bidirectional scanning module 35.

Figure 7:
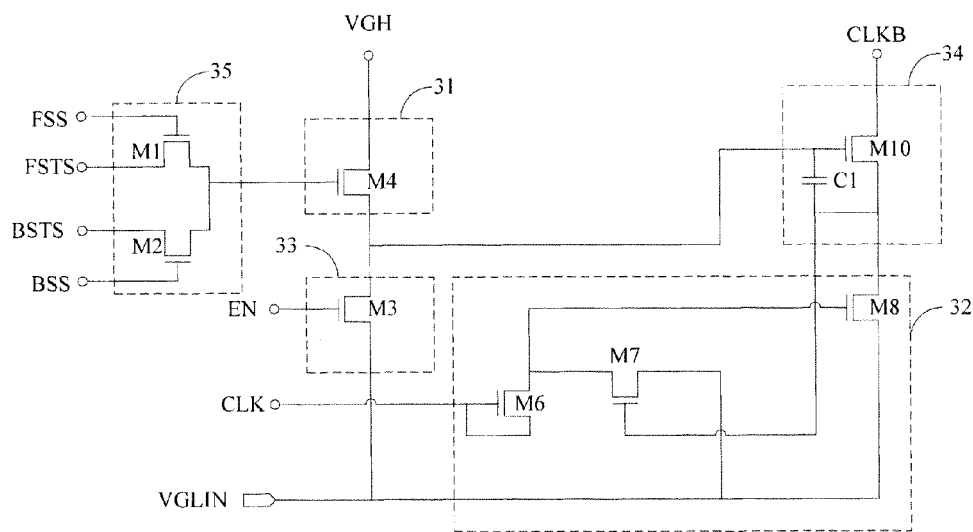
FIG. 7 is a structural schematic view of a shift register unit provided by Embodiment Five of the present invention.

The bidirectional scanning module 35 is used for outputting a high level scan trigger signal STS to the pull-up drive module 31 when the received forward scan signal FSS is of high level and the received forward scan trigger signal FSTS is of high level; or outputting a high level scan trigger signal STS to the pull-up drive module 31 when the received backward scan signal BSS is of high level and the received backward scan trigger signal BSTS is of high level.

Wherein the bidirectional scanning module 35 can be realized with the circuit structure as shown in FIG. 7. The bidirectional scanning module 35 may comprise a first transistor M1 and a second transistor M2; the gate of the first transistor M1 receives the forward scan signal FSS, the first electrode of the first transistor M1 receives the forward scan trigger signal FSTS, the first transistor M1 is used for outputting the scan trigger signal FSTS through the second electrode of the first transistor M1 under the control of the forward scan signal FSS; i.e., the first transistor M1 is turned on when the forward scan signal FSS is of high level, thereby outputting the received forward scan trigger signal FSTS through the second electrode of the first transistor M1, and is turned off when the forward scan signal FSS is of low level.

The gate of the second transistor M2 receives a backward scan signal BSS, the first electrode of the second transistor M2 receives a backward scan trigger signal BSTS, the second transistor M2 is used for outputting the scan trigger signal BSTS through the second electrode of the second transistor M2 under the control of the backward scan signal BSS; i.e., the second transistor M2 is turned on when the backward scan signal BSS is of high level, thereby outputting the received backward scan trigger signal BSTS through the second electrode of the second transistor M2, and is turned off when the backward scan signal BSS is of low level.

Figure 5:
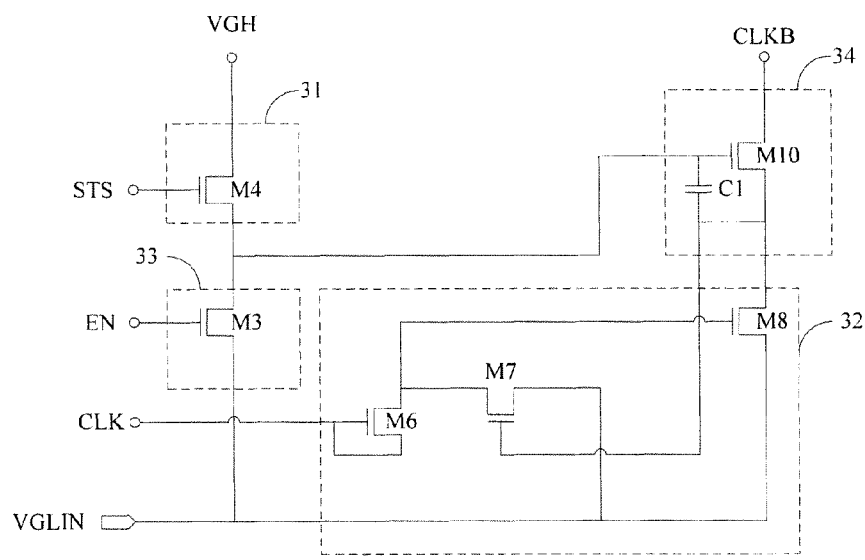
FIG. 5 is a structural schematic view of a shift register unit provided by Embodiment Three of the present invention.

The shift register unit provided by Embodiment Three of the present invention is as shown in FIG. 5, wherein the second pull-down drive module 33 comprises a third transistor M3.

The gate of the third transistor M3 receives an enable signal EN, the first electrode of the third transistor is connected with the low level signal end VGLIN, the third transistor M3 is used for outputting the low level signal VGL through the second electrode of the third transistor M3 under the control of the enable signal EN, i.e., the third transistor M3 is turned on when the enable signal EN is of high level, thereby outputting the low level signal VGL through the second electrode of the third transistor M3, and is turned off when the enable signal EN is of low level, thereby not outputting the low level signal VGL any more.

In the shift register unit as shown in FIG. 5, the pull-up drive module 31 comprises a fourth transistor M4; the gate of the fourth transistor M4 receives the scan trigger signal STS, the first electrode of the fourth transistor M4 receives a high level signal VGH, the fourth transistor M4 is used for outputting the high level signal VGH through the second electrode of the fourth transistor M4 under the control of the scan trigger signal STS, i.e., the fourth transistor is turned on when the scan trigger signal STS is of high level, thereby outputting the high level signal VGH through the second electrode of the fourth transistor M4, and is turned off when the scan trigger signal STS is of low level, thereby not outputting the high level signal VGH any more.

In the shift register unit as shown in FIG. 5, the first pull-down drive module 32 comprises a sixth transistor M6, a seventh transistor M7 and an eighth transistor M8.

The gate of the sixth transistor M6 receives the clock signal CLK, the first electrode of the sixth transistor M6 is connected with the gate of the sixth transistor M6, the second electrode of the sixth transistor M6 is connected with the first electrode of the seventh transistor M7 and the gate of the eighth transistor M8 respectively, the gate of the seventh transistor M7 is connected with the output end OUT of the shift register unit, the second electrode of the seventh transistor M7 receives the low level signal VGL (in FIG. 5, the second electrode of the seventh transistor M7 is connected with the low level signal end VGLIN), the first electrode of the eighth transistor M8 is connected with the output end OUT of the shift register unit, the second electrode of the eighth transistor M8 receives the low level signal VGL (in FIG. 5, the second electrode of the eighth transistor M8 is connected with the low level signal end VGLIN).

Wherein the sixth transistor M6 is turned on when the clock signal CLK is of high level, so as to output the high level signal through the second electrode of the sixth transistor M6, and is turned off when the clock signal CLK is of low level. The seventh transistor M7 is turned on when the output end of the shift register unit is of high level, thereby setting the gate of the eighth transistor M8 as a low level, such that the eighth transistor M8 is turned off; and is turned off when the output end of the shift register unit is of low level. The eighth transistor M8 is turned on when the sixth transistor M6 is turned on and the seventh transistor M7 is turned off, thereby connecting the output end OUT of the shift register unit with a low level signal end VGLIN, and is turned off when the sixth transistor M6 is turned off and the seventh transistor M7 is turned on, thereby disconnecting the output end OUT of the shift register unit from the low level signal end VGLIN, and is turned on according to the signal (the stored signal is a high level signal) stored by the parasitic capacitance on the eighth transistor M8 when the sixth transistor M6 is turned off and the seventh transistor M7 is turned off, thereby connecting the output end OUT of the shift register unit with the low level signal end VGLIN.

In the shift register unit as shown in FIG. 5, the output module 34 comprises a tenth transistor M10 and a first capacitor C1; the gate of the tenth transistor M10 receives the signal outputted by the pull-up drive module 31 and the signal outputted by the second pull-down drive module 33 respectively; the first electrode of the tenth transistor M10 receives the clock blocking signal CLKB, the second electrode of the tenth transistor M10 is the output end OUT of the shift register unit; one end of the first capacitor C1 is connected with the gate of the tenth transistor M10, the other end of the first capacitor C1 is connected with the output end OUT of the shift register unit.

Wherein the tenth transistor M10 is used for outputting the received clock blocking signal CLKB through the output end OUT of the shift register unit when the signal on its gate (i.e., the signal stored by the first capacitor C1) is of high level, and not outputting the received clock blocking signal CLKB any more when the signal on its gate is of low level. The first capacitor C1 is used for storing the signal on the gate of the tenth transistor M10.

Figure 6:
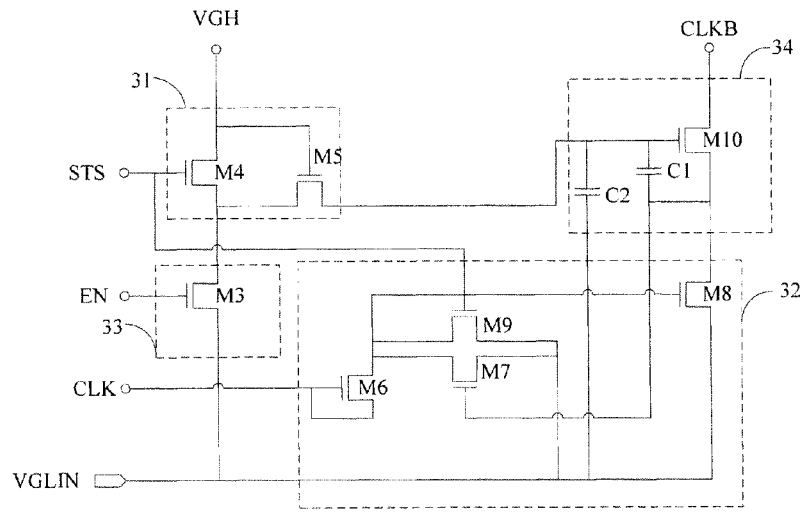
FIG. 6 is a structural schematic view of a shift register unit provided by Embodiment Four of the present invention.

The shift register unit provided by Embodiment Four of the present invention is as shown in FIG. 6. Compared with the structure of the shift register unit as shown in FIG. 5, in the structure of the shift register unit as shown in FIG. 6, the pull-up drive module 31 further comprises a fifth transistor M5; the gate of the fifth transistor M5 receives a high level signal VGH, the first electrode of the fifth transistor M5 is connected with the second electrode of the fourth transistor M4, the fifth transistor M5 is used for outputting the signal on the second electrode of the fourth transistor M4 to the output module 34 through the second electrode of the fifth transistor M5. Here, the second pull-down drive module 33 in FIG. 6 outputs the low level signal to the output module 34 through the pull-up drive module 31 when the received enable signal EN is a high level.

Since the gate of the fifth transistor M5 receives the high level signal VGH, the fifth transistor M5 is always turned on.

Compared with the structure of the shift register unit as shown in FIG. 5, in the structure of the shift register unit as shown in FIG. 6, the first pull-down drive module 32 further comprises a ninth transistor M9; the gate of the ninth transistor M9 receives the scan trigger signal STS, the first electrode of the ninth transistor M9 is connected with the second electrode of the sixth transistor M6, the second electrode of the ninth transistor M9 receives the low level signal VGL (in FIG. 6, the second electrode of the ninth transistor M9 is connected with the low level signal end VGLIN); the ratio between the size of the sixth transistor M6 and the size of the ninth transistor M9 is a preset value, thereby enabling the gate of the eighth transistor M8 to be of high level when the sixth transistor M6 and the ninth transistor M9 are both turned on, so that the eighth transistor M8 is turned on.

Compared with the structure of the shift register unit as shown in FIG. 5, in the structure of the shift register unit as shown in FIG. 6, the output module 34 further comprises a second capacitor C2, one end of the second capacitor C2 is connected with the gate of the tenth transistor M10, the other end of the second capacitor C2 receives the low level signal VGL, in FIG. 6, the other end of the second capacitor C2 is connected with the low level signal end VGLIN.

Certainly, any one or any two of the fifth transistor M5, the ninth transistor M9 and the second capacitor C2 may be added on the basis of the structure of the shift register unit as shown in FIG. 5. The connection relation of the added fifth transistor M5, the ninth transistor M9 and/or the second capacitor C2 may refer to the shift register unit as shown in FIG. 6.

Currently, in some special situations, the image displayed on the display panel needs to be turned over for 180°, hence, the shift register unit in the display panel should be able to perform bidirectional scanning, i.e., the shift register unit in the liquid crystal panel is a bidirectional scan shift register unit.

Therefore, the shift register unit provided by Embodiment Five of the present invention is as shown in FIG. 7. Compared with the structure of the shift register unit as shown in FIG. 5, the structure of the shift register unit as shown in FIG. 7 further comprises a bidirectional scan module 35, the bidirectional scan module 35 comprises a first transistor M1 and a second transistor M2; the gate of the first transistor M1 receives a forward scan signal FSS, the first electrode of the first transistor M1 receives a forward scan trigger signal FSTS, the first transistor M1 is used for outputting the scan trigger signal FSTS through the second electrode of the first transistor M1 under the control of the forward scan signal FSS; i.e., the first transistor M1 is turned on when the forward scan signal FSS is of high level, thereby outputting the received forward scan trigger signal FSTS through the second electrode of the first transistor M1, and is turned off when the forward scan signal FSS is of low level.

The gate of the second transistor M2 receives a backward scan signal BSS, the first electrode of the second transistor M2 receives a backward scan trigger signal BSTS, the second transistor M2 is used for outputting the scan trigger signal BSTS through the second electrode of the second transistor M2 under the control of the backward scan signal BSS; i.e., the second transistor M2 is turned on when the backward scan signal BSS is of high level, thereby outputting the received backward scan trigger signal BSTS through the second electrode of the second transistor M2, and is turned off when the backward scan signal BSS is of low level.

Figure 8:
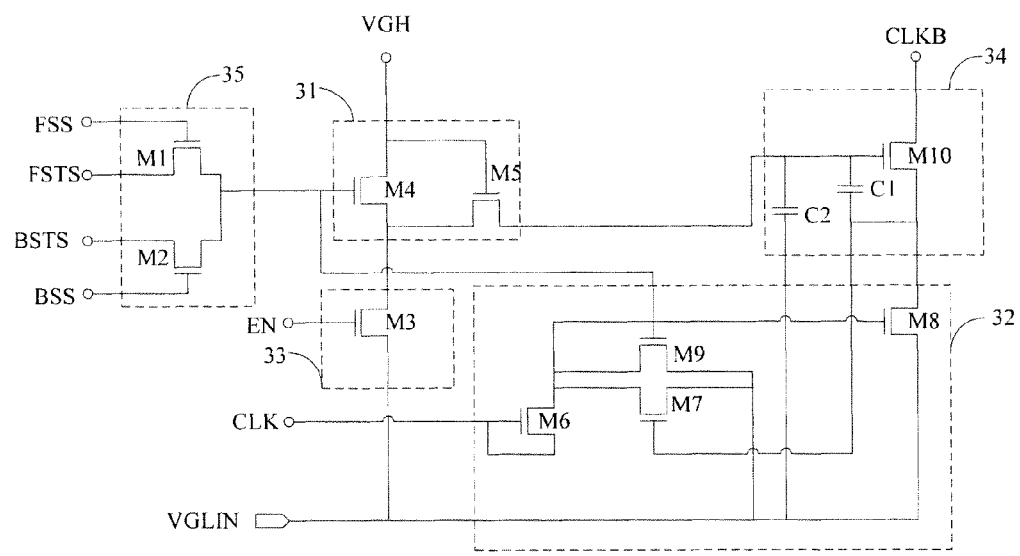
FIG. 8 is a structural schematic view of a shift register unit provided by Embodiment Six of the present invention.

The shift register unit provided by Embodiment Six of the present invention is as shown in FIG. 8. Compared with the structure of the shift register unit as shown in FIG. 6, the structure of the shift register unit as shown in FIG. 8 further comprises a bidirectional scan module 35, wherein the structure of the bidirectional scan module 35 in FIG. 8 is same as the structure of the bidirectional scan module 35 in FIG. 7, which will not be repeated here.

Certainly, any one or any two of the fifth transistor M5, the ninth transistor M9 and the second capacitor C2 may be added on the basis of the structure of the shift register unit as shown in FIG. 7. The connection relation of the added fifth transistor M5, the ninth transistor M9 and/or the second capacitor C2 may refer to the shift register unit as shown in FIG. 8.

As for a transistor in the liquid crystal display field or the organic light-emitting diode (OLED) field, there is no explicit difference between the drain and the source, hence, the first electrode of the transistor mentioned in the embodiments of the present invention may be the source (or the drain) of the transistor, the second electrode of the transistor may be the drain (or the source) of the transistor. If the source of the transistor is the first electrode, then the drain of the transistor is the second electrode; if the drain of the transistor is the first electrode, then the source of the transistor is the second electrode.

Figure 9:
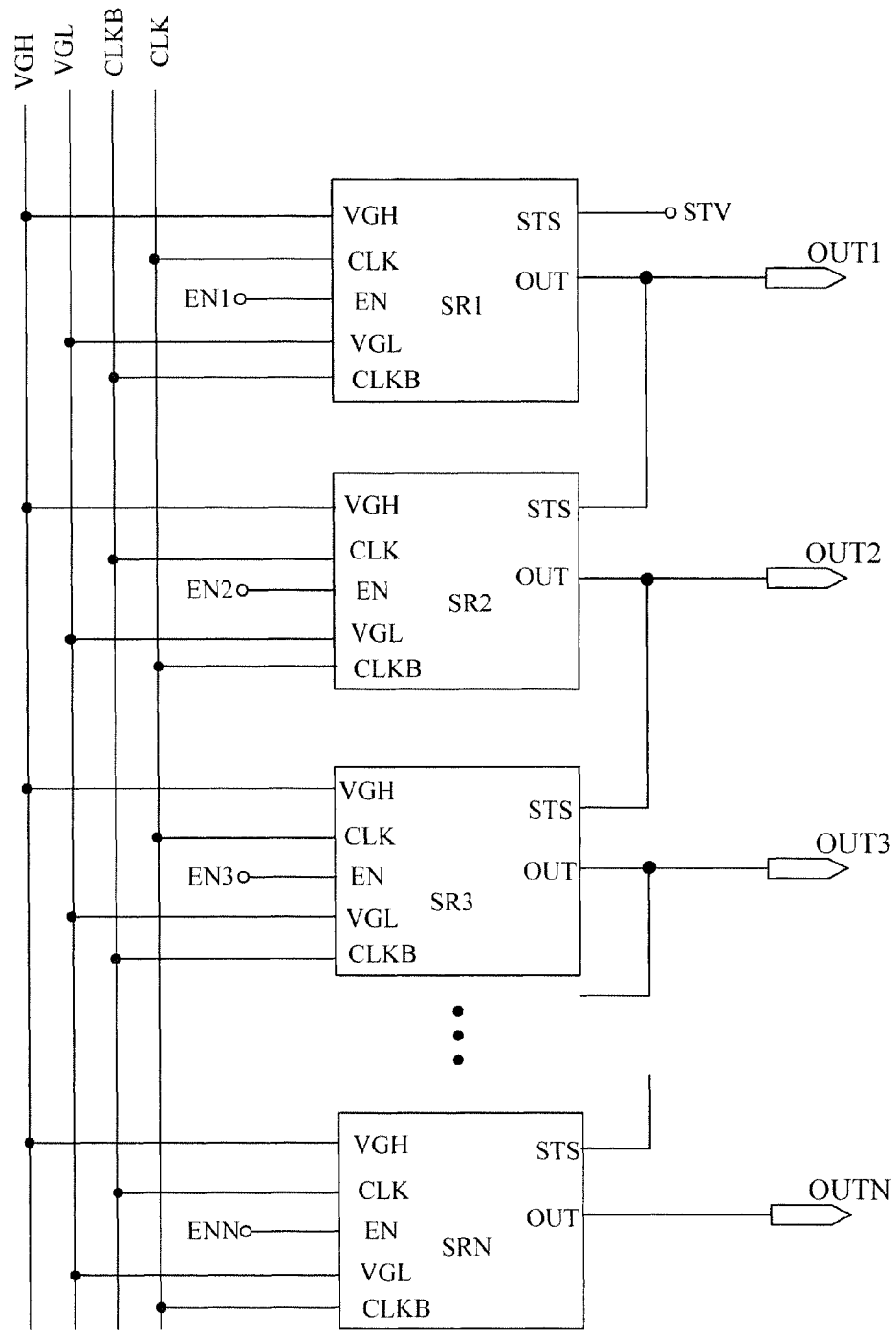
FIG. 9 is a structural schematic view of a shift register unit provided by Embodiment Seven of the present invention.

The gate driving device provided by Embodiment Seven of the present invention is as shown in FIG. 9, each stage of shift register unit therein is the shift register unit provided by Embodiment One, Embodiment Three or Embodiment Four of the present invention, i.e. the shift register unit does not comprise the bidirectional scan module. The gate driving device comprises multiple stages of shift register unit SR; except for the first stage of shift register unit SR1, each stage of shift register unit receives a signal outputted by a previous stage of shift register unit of itself as a scan trigger signal STS, i.e., the nth stage of shift register unit SRn receives the signal OUTn outputted by the n−1th stage of shift register unit SRn−1 as the scan trigger signal STS; the first stage of shift register unit SR1 receives an initial trigger signal STV as the scan trigger signal STS.

Figure 10:
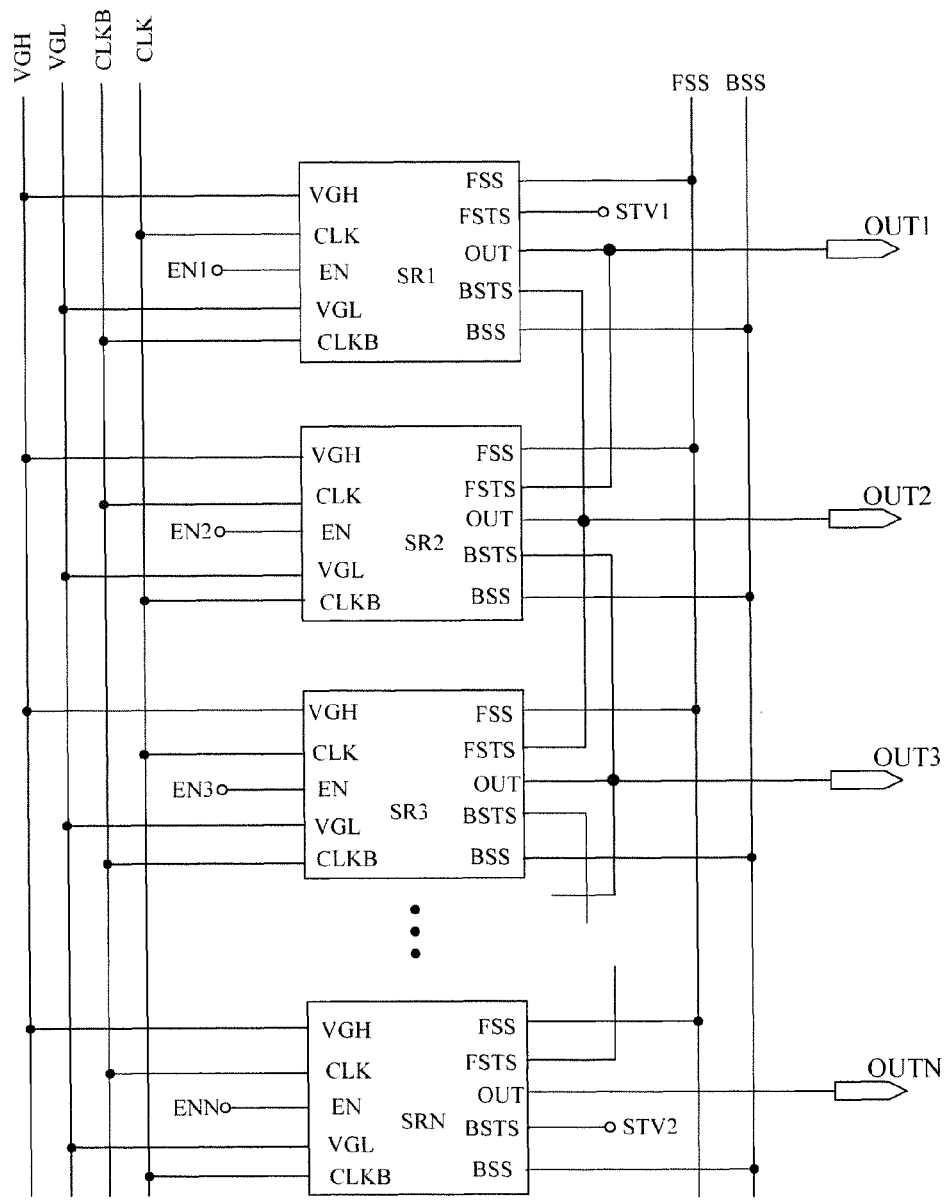
FIG. 10 is a structural schematic view of a shift register unit provided by Embodiment Eight of the present invention.

The gate driving device provided by Embodiment Eight of the present invention is as shown in FIG. 10, each stage of shift register unit therein is the shift register unit provided by Embodiment Two, Embodiment Five or Embodiment Six of the present invention, i.e., the shift register unit comprises a bidirectional scan module. The gate driving device comprises multiple stages of shift register unit; except for the first stage of shift register unit SR1 and the last stage of shift register unit SRN, each stage of shift register unit receives a signal outputted by a previous stage of shift register unit of itself as a forward scan trigger signal FSTS, and receives a signal outputted by a next stage of shift register unit of itself as a backward scan trigger signal BSTS, i.e., the nth stage of shift register unit SRn receives the signal OUTn−1 outputted by the n−1th stage of shift register unit SRn−1 as the forward scan trigger signal FSTS, and receives the signal OUTn+1 outputted by the n+1 th stage of shift register unit SRn+1 as the backward scan trigger signal BSTS; the first stage of shift register unit SR1 receives a first initial trigger signal STV1 as the forward scan trigger signal FSTS, and receives a signal OUT2 outputted by a second stage of shift register unit SR2 as the backward scan trigger signal BSTS; the last stage of shift register unit SRN receives a second initial trigger signal STV2 as the backward scan trigger signal BSTS, the last stage of shift register unit SRN receives a signal OUTN−1 outputted by a previous stage of shift register unit SRN−1 of itself as the forward scan trigger signal FSTS.

Thus, when the forward scan signal FSS is of high level, and the backward scan signal BSS is of low level, the gate driving device provided by Embodiment Eight of the present invention performs forward scanning; when the forward scan signal FSS is of low level and the backward scan signal BSS is of high level, the gate driving device provided by Embodiment Eight of the present invention performs backward scanning.

In the gate driving device provided by Embodiment Seven or Embodiment Eight of the present invention, the clock signals CLK received by two adjacent stages of shift register unit are contrary, and the received clock blocking signals CLKB are contrary, that is to say, the output module 34 of the nth stage of shift register unit receives the clock blocking signal CLKB, the first pull-down drive module 32 of the nth stage of shift register unit receives the clock signal CLK, then the output module 34 of the n+1 th stage of shift register unit receives the clock signal CLK, the first pull-down drive module 32 of the n+1th stage of shift register unit receives the clock blocking signal CLKB.

In order to explain the shift register unit and the gate driving device provided by the embodiments of the present invention further, the working principles thereof will be explained below in combination with the sequence diagram.

Figure 11A:
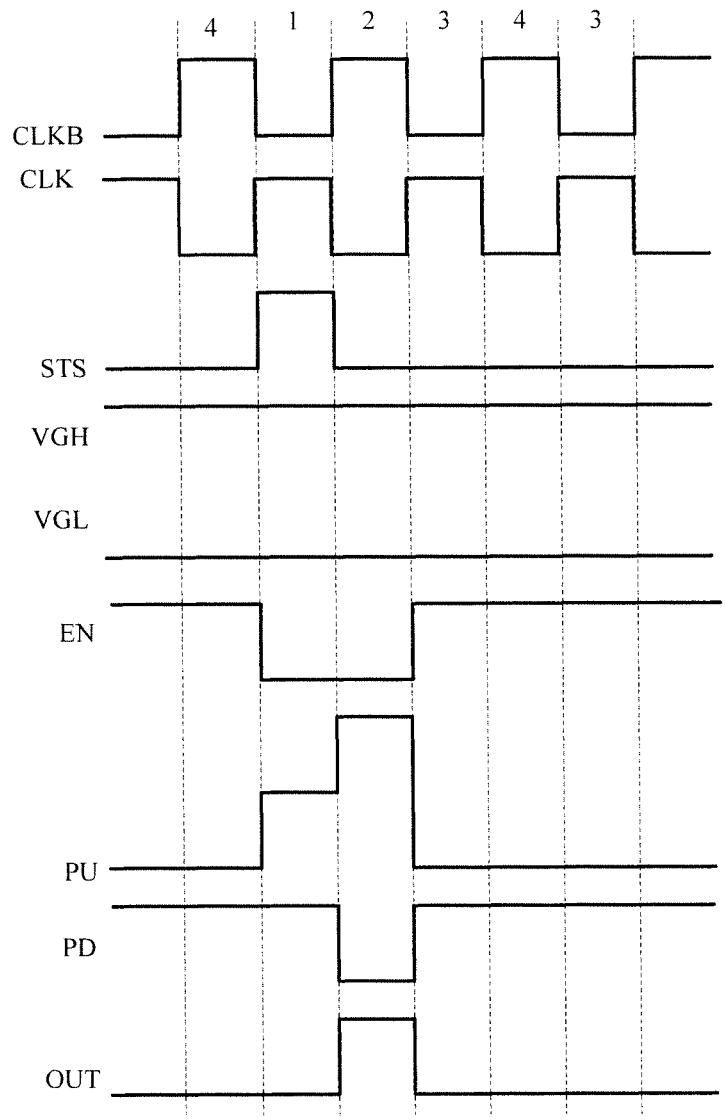
FIG. 11a and FIG. 11b are working sequence diagrams of a shift register unit provided by an embodiment of the present invention, which shift register unit does not comprise a bidirectional scanning module.
Figure 11B:
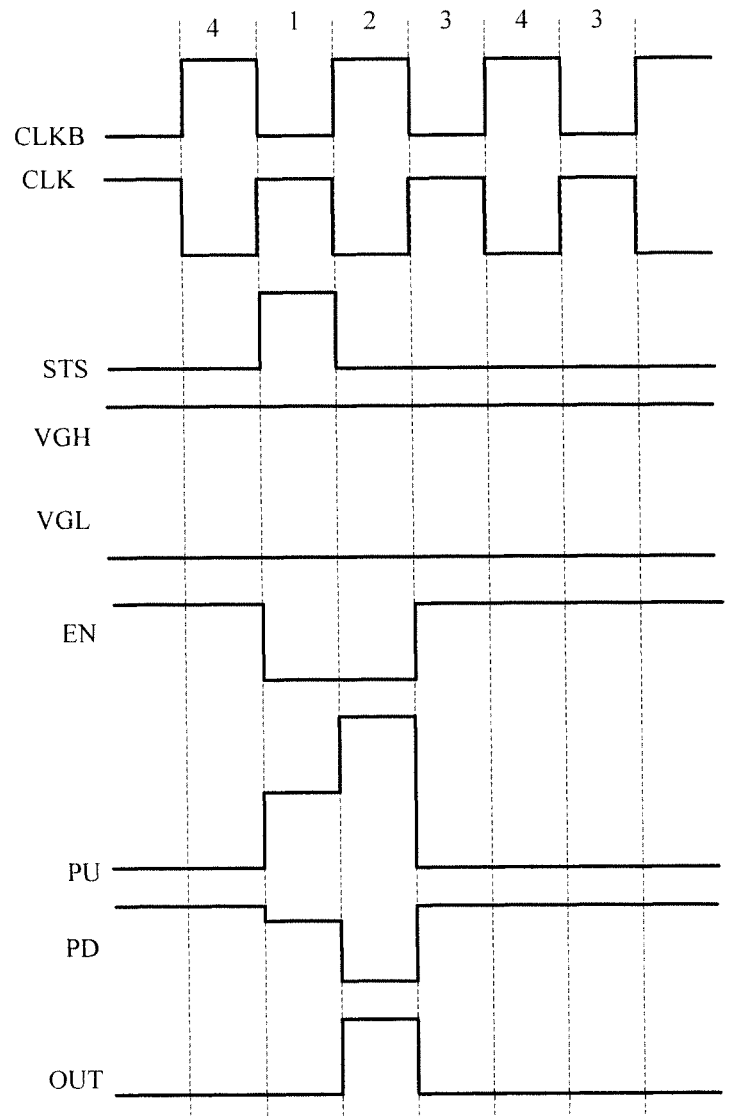

When the shift register unit provided by the embodiments of the present invention does not comprise the bidirectional scan module, its working sequence diagram is as shown in FIG. 11a or FIG. 11b, which may be divided into four phases.

First Phase: The scan trigger signal STS is of high level, the fourth transistor M4 is turned on, if the shift register unit only comprises a first capacitor C1, the first capacitor C1 will be charged through the fourth transistor M4 (if the shift register unit further comprises a fifth transistor M5, the first capacitor C1 will be charged through the fourth transistor M4 and the fifth transistor M5); if the shift register unit comprises a first capacitor C1 and a second capacitor C2, the first capacitor C1 and the capacitor C2 will be both charged through the fourth transistor M4 (if the shift register unit further comprises a fifth transistor M5, the first capacitor C1 and the second capacitor C2 will be both charged through the fourth transistor M4 and the fifth transistor M5); moreover, since the enable signal EN is of low level, the third transistor M3 is turned off, such that the potential of the pull-up node PU (i.e., the gate of the tenth transistor M10) is pulled to a high potential, the tenth transistor M10 is turned on; since the clock blocking signal CLKB here is of low level, the output end of the shift register unit is of low level; the clock signal CLK is of high level, the sixth transistor M6 is turned on; since the output end of the shift register unit here is of low level, the seventh transistor M7 is turned off; if the shift register unit does not comprise the ninth transistor M9, the sixth transistor M6 will pull the gate of the eighth transistor M8, i.e. the pull-down node PD to a high potential (as shown in FIG. 11a), hence, the eighth transistor M8 is turned on; if the shift register unit comprises the ninth transistor M9, although the ninth transistor M9 is turned on when the scan trigger signal STS is of high level, since the ratio between the size of the sixth transistor M6 and the size of the ninth transistor M9 can make the voltage of the gate of the eighth transistor M8, i.e., the pull-down node PD be of high level when the sixth transistor M6 and the ninth transistor M9 are both turned on (as shown in FIG. 11b), hence the eighth transistor M8 is turned on; thereby enabling the output end OUT of the shift register unit to be connected with the low level signal end VGLIN, the output end OUT of the shift register unit is of low level.

Second Phase: The scan trigger signal STS is of low level, the fourth transistor M4 is turned off, however, due to the storage function of the first capacitor C1, (due to the storage function of the first capacitor C1 and the second capacitor C2 if the shift register unit further comprises a second capacitor C2), the potential of the pull-up node PU remains high, the tenth transistor M10 is turned on; since the clock blocking signal CLKB here is of high level, the output end OUT of the shift register unit is of high level; since the enable signal EN is of low level, the third transistor M3 is turned off, hence, under the bootstrap function of the first capacitor C1 (under the bootstrap function of the first capacitor and the second capacitor C2 if the shift register unit further comprises a second capacitor C2), the potential of the pull-up node PU continues to rise on the basis of the first phase; the clock signal CLK is of low level, the sixth transistor M6 is turned off; since the output end OUT of the shift register unit here is of high level, the seventh transistor M7 is turned on; if the shift register unit does not comprise the ninth transistor M9, the seventh transistor M7 will pull the gate of the eighth transistor M8 to a low potential, hence, the eighth transistor M8 is turned off; if the shift register unit comprises the ninth transistor M9, however, the scan trigger signal STS is of low level in the second phase, hence, the ninth transistor M9 is turned off; the seventh transistor M7 can still pull the gate of the eighth transistor M8, i.e., the pull-down node PD to a low potential, hence, the eighth transistor M8 is turned off; thereby enabling the output end OUT of the shift register unit to be disconnected from the low level signal end VGLIN, so as to ensure the output end OUT of the shift register unit to be of high level.

Third Phase: The enable signal EN is of high level, the third transistor M3 is turned on, hence, the pull-up node PU is connected with the low level signal end VGLIN through the third transistor M3 (if the shift register unit further comprises a fifth transistor M5, the pull-up node PU will be connected with the low level signal end VGLIN through the third transistor M3 and the fifth transistor M5), thereby releasing the high level signal stored on the first capacitor C1 (if the shift register unit comprises a first capacitor C1 and a second capacitor C2, the high level signals stored on the first capacitor C1 and the second capacitor C2 will be released), such that the potential on the pull-up node PU is set to be of low level, the tenth transistor M10 is turned off; moreover, since in the third phase, the clock signal SLK is of high level, the sixth transistor M6 is turned on; if the shift register unit does not comprise the ninth transistor M9, the sixth transistor M6 will pull the gate of the eighth transistor M8, i.e., the pull-down node PD to a high potential, and the parasitic capacitance of the eighth transistor M8 will store the signal of the pull-down node PD, hence, the eighth transistor M8 is turned on; if the shift register unit comprises the ninth transistor M9, however, since in the third phase, the scan trigger signal STS is of low level, the ninth transistor M9 is turned off, the sixth transistor M6 can still set the voltage of the pull-down node PD to be of high level, hence, the eighth transistor M8 is turned on; thereby enabling the output end OUT of the shift register unit to be connected with the low level signal end VGLIN, the output end OUT of the shift register unit is of low level.

Fourth Phase: The enable signal EN is of high level, the third transistor M3 is turned on, hence, the pull-up node PU is connected with the low level signal end VGLIN through the third transistor M3 (if the shift register unit further comprises a fifth transistor M5, the pull-up node PU will be connected with the low level signal end VGLIN through the third transistor M3 and the fifth transistor M5), the pull-up node PU remains at a low potential; moreover, since in the fourth phase, the clock signal CLK is of low level, the sixth transistor M6 is turned off; if the shift register unit does not comprise the ninth transistor M9, due to the storage function of the parasitic capacitance on the eighth transistor M8, the pull-down node PD remains at a high potential, hence, the eighth transistor M8 is turned on; if the shift register unit comprises the ninth transistor M9, however, since in the fourth phase the scan trigger signal STS is of low level, the ninth transistor M9 is turned off; due to the storage function of the parasitic capacitance on the eighth transistor M8, the pull-down node PD remains at a high potential, hence, the eighth transistor M8 is turned on; thereby enabling the output end OUT of the shift register unit to be connected with the low level signal end VGLIN, the output end OUT of the shift register unit is of low level.

Thereafter, the third phase and the fourth phase are repeated successively until the scan trigger signal STS received by the shift register unit provided by the embodiments of the present invention is of high level, then the first phase is performed again. Thus in the third phase and the fourth phase, i.e., within the non-working time of the shift register unit provided by the embodiments of the present invention, since the eighth transistor M8 is turned on, the noise at the output end OUT of the shift register unit can be released to the low level signal end VGLIN, thereby reducing the noise in the signal outputted by the shift register unit in the non-working time.

Figure 12A:
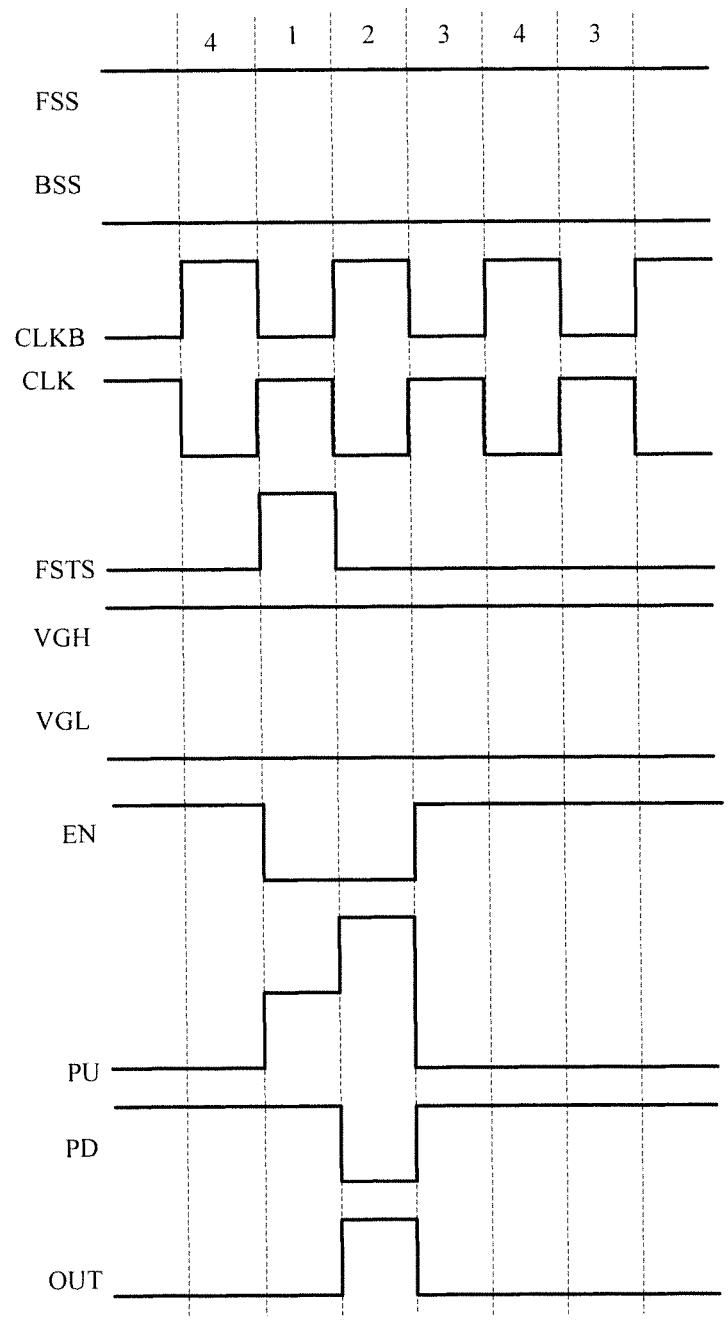
FIG. 12a and FIG. 12b are working sequence diagrams of a shift register unit in forward scanning provided by an embodiment of the present invention, which shift register unit comprises a bidirectional scanning module.
Figure 12B:
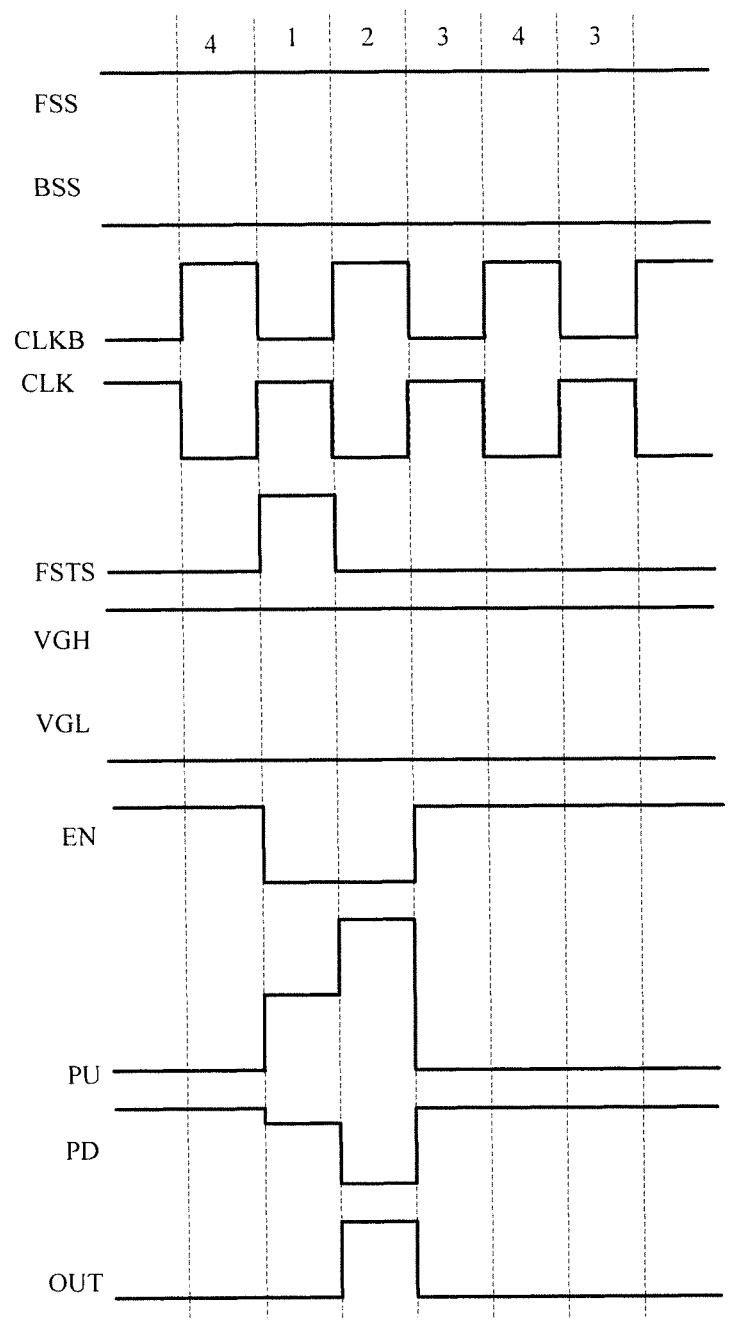

When the shift register unit provided by the embodiments of the present invention comprises a bidirectional scan module, the forward scan signal FSS is of high level, and the backward scan signal BSS is of low level, its working sequence diagram is as shown in FIG. 12a or FIG. 12b, which may be divided into four phases. When performing forward scanning, since the forward scan signal FSS is of high level, the first transistor M1 is turned on, thereby transmitting the forward scan trigger signal FSTS to the gate of the fourth transistor M4; while since the backward scan signal BSS is of low level, the second transistor M2 is turned off.

First Phase: The forward scan trigger signal FSTS is of high level, the fourth transistor M4 is turned on; if the shift register unit only comprises a first capacitor C1, the first capacitor C1 will be charged through the fourth transistor M4 (if the shift register unit further comprises a fifth transistor M5, the first capacitor C1 will be charged through the fourth transistor M4 and the fifth transistor M5); if the shift register unit comprises a first capacitor C1 and a second capacitor C2, the first capacitor C1 and the capacitor C2 will be both charged through the fourth transistor M4 (if the shift register unit further comprises a fifth transistor M5, the first capacitor C1 and the second capacitor C2 will be both charged through the fourth transistor M4 and the fifth transistor M5); moreover, since the enable signal EN is of low level, the third transistor M3 is turned off, such that the potential of the pull-up node PU (i.e., the gate of the tenth transistor M10) is pulled to a high potential, the tenth transistor M10 is opened; since the clock blocking signal CLKB here is of low level, the output end of the shift register unit is of low level; the clock signal CLK is of high level, the sixth transistor M6 is turned on; since the output end of the shift register unit here is of low level, the seventh transistor M7 is turned off; if the shift register unit does not comprise the ninth transistor M9, the sixth transistor M6 will pull the gate of the eighth transistor M8, i.e. the pull-down node PD to a high potential (as shown in FIG. 12a), hence, the eighth transistor M8 is turned on; if the shift register unit comprises the ninth transistor M9, although the ninth transistor M9 is turned on when the forward scan trigger signal FSTS is of high level, since the ratio between the size of the sixth transistor M6 and the size of the ninth transistor M9 can make the voltage of the gate of the eighth transistor M8, i.e., the pull-down node PD be of high level when the sixth transistor M6 and the ninth transistor M9 are both turned on (as shown in FIG. 12b), hence the eighth transistor M8 is turned on; thereby enabling the output end OUT of the shift register unit to be connected with the low level signal end VGLIN, the output end OUT of the shift register unit is of low level.

Second Phase: The forward scan trigger signal FSTS is of low level, the fourth transistor M4 is turned off; however, due to the storage function of the first capacitor C1, (due to the storage function of the first capacitor C1 and the second capacitor C2 if the shift register unit further comprises a second capacitor C2), the potential of the pull-up node PU remains high, the tenth transistor M10 is turned on; since the clock blocking signal CLKB here is of high level, the output end OUT of the shift register unit is of high level; moreover, since the enable signal EN is of low level, the third transistor M3 is turned off, hence, under the bootstrap function of the first capacitor C1 (under the bootstrap function of the first capacitor and the second capacitor C2 if the shift register unit further comprises a second capacitor C2), the potential of the pull-up node PU continues to rise on the basis of the first phase; the clock signal CLK is of low level, the sixth transistor M6 is turned off; since the output end OUT of the shift register unit here is of high level, the seventh transistor M7 is turned on; if the shift register unit does not comprise the ninth transistor M9, the seventh transistor M7 will pull the gate of the eighth transistor M8 to a low potential, hence, the eighth transistor M8 is turned off; if the shift register unit comprises the ninth transistor M9, however, the forward scan trigger signal FSTS is of low level in the second phase, hence, the ninth transistor M9 is turned off, the seventh transistor M7 can still pull the gate of the eighth transistor M8, i.e., the pull-down node PD to a low potential, hence, the eighth transistor M8 is turned off; thereby enabling the output end OUT of the shift register unit to be disconnected from the low level signal end VGLIN, so as to ensure the output end OUT of the shift register unit to be of high level.

Third Phase: The enable signal EN is of high level, the third transistor M3 is turned on, hence, the pull-up node PU is connected with the low level signal end VGLIN through the third transistor M3 (if the shift register unit further comprises a fifth transistor M5, the pull-up node PU will be connected with the low level signal end VGLIN through the third transistor M3 and the fifth transistor M5), thereby releasing the high level signal stored on the first capacitor C1 (if the shift register unit comprises a first capacitor C1 and a second capacitor C2, the high level signals stored on the first capacitor C1 and the second capacitor C2 will be released), such that the potential on the pull-up node PU is set to be of low level, the tenth transistor M10 is turned off; moreover, since in the third phase, the clock signal SLK is of high level, the sixth transistor M6 is turned on; if the shift register unit does not comprise the ninth transistor M9, the sixth transistor M6 will pull the gate of the eighth transistor M8, i.e., the pull-down node PD to a high potential, and the parasitic capacitance of the eighth transistor M8 will store the signal of the pull-down node PD, hence, the eighth transistor M8 is turned on; if the shift register unit comprises the ninth transistor M9, however, since in the third phase, the forward scan trigger signal FSTS is of low level, the ninth transistor M9 is turned off, the sixth transistor M6 can still set the voltage of the pull-down node PD to be of high level, hence, the eighth transistor M8 is turned on; thereby enabling the output end OUT of the shift register unit to be connected with the low level signal end VGLIN, the output end OUT of the shift register unit is of low level.

Fourth Phase: The enable signal EN is of high level, the third transistor M3 is turned on, hence, the pull-up node PU is connected with the low level signal end VGLIN through the third transistor M3 (if the shift register unit further comprises a fifth transistor M5, the pull-up node PU will be connected with the low level signal end VGLIN through the third transistor M3 and the fifth transistor M5), the pull-up node PU remains at a low potential; while since in the fourth phase, the clock signal CLK is of low level, the sixth transistor M6 is turned off; if the shift register unit does not comprise the ninth transistor M9, due to the storage function of the parasitic capacitance on the eighth transistor M8, the pull-down node PD remains at a high potential, hence, the eighth transistor M8 is turned on; if the shift register unit comprises the ninth transistor M9, however, since in the fourth phase the forward scan trigger signal FSTS is of low level, the ninth transistor M9 is turned off, due to the storage function of the parasitic capacitance on the eighth transistor M8, the pull-down node PD remains at a high potential, hence, the eighth transistor M8 is turned on; thereby enabling the output end OUT of the shift register unit to be connected with the low level signal end VGLIN, the output end OUT of the shift register unit is of low level.

Thereafter, the third phase and the fourth phase are repeated successively until the forward scan trigger signal FSTS received by the shift register unit provided by the embodiments of the present invention is of high level, then the first phase is performed again. Thus in the third phase and the fourth phase, i.e., within the non-working time of the shift register unit provided by the embodiments of the present invention, since the eighth transistor M8 is turned on, the noise at the output end OUT of the shift register unit can be released to the low level signal end VGLIN, thereby reducing the noise in the signal outputted by the shift register unit in the non-working time.

Figure 13A:
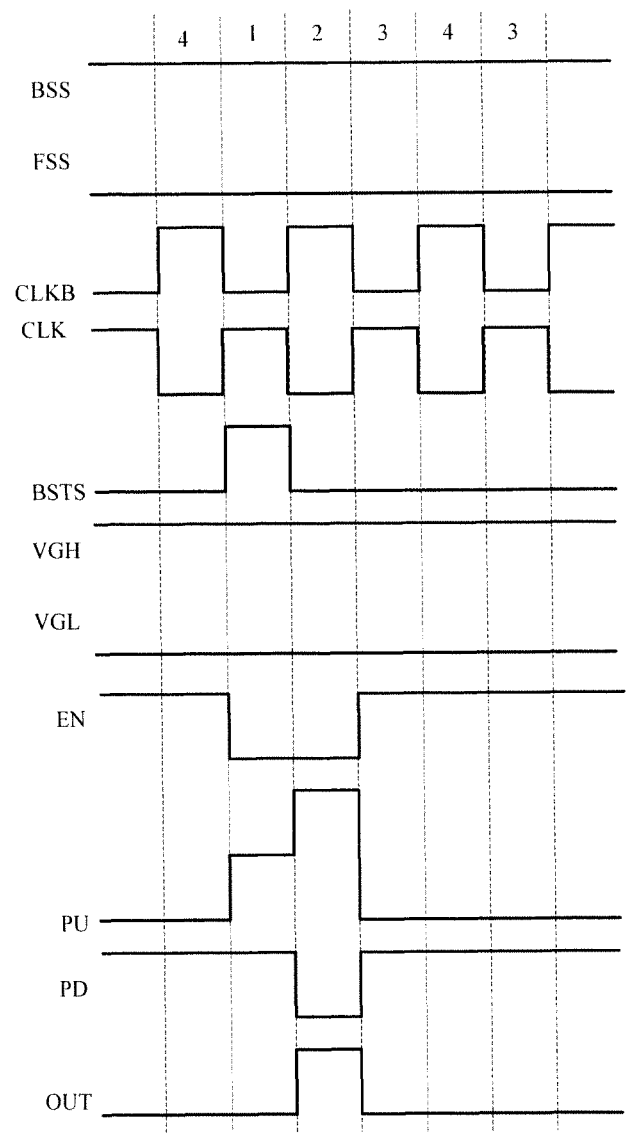
FIG. 13a and FIG. 13b are working sequence diagrams of a shift register unit in backward scanning provided by an embodiment of the present invention, which shift register unit comprises a bidirectional scanning module.
Figure 13B:
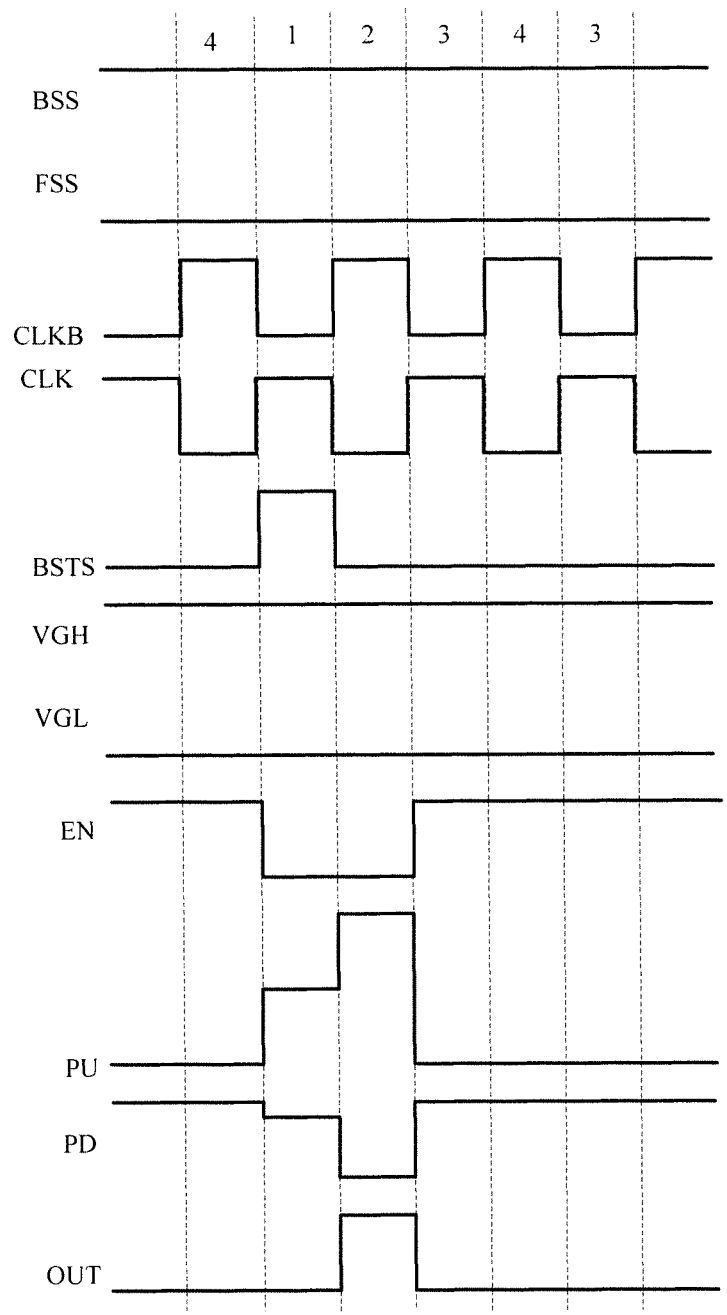

When the shift register unit provided by the embodiments of the present invention comprises a bidirectional scan module, the forward scan signal FSS is of low level, and the backward scan signal BSS is of high level, its working sequence diagram is as shown in FIG. 13a or FIG. 13b, which may be divided into four phases. When performing backward scanning, since the backward scan signal BSS is of high level, the second transistor M2 is turned on, thereby transmitting the backward scan trigger signal BSTS to the gate of the fourth transistor M4; while since the forward scan signal FSS is of low level, the first transistor M1 is turned off.

First Phase: The backward scan trigger signal BSTS is of high level, the fourth transistor M4 is turned on; if the shift register unit only comprises a first capacitor C1, the first capacitor C1 will be charged through the fourth transistor M4 (if the shift register unit further comprises a fifth transistor M5, the first capacitor C1 will be charged through the fourth transistor M4 and the fifth transistor M5); if the shift register unit comprises a first capacitor C1 and a second capacitor C2, the first capacitor C1 and the capacitor C2 will be both charged through the fourth transistor M4 (if the shift register unit further comprises a fifth transistor M5, the first capacitor C1 and the second capacitor C2 will be both charged through the fourth transistor M4 and the fifth transistor M5), moreover, since the enable signal EN is of low level, the third transistor M3 is turned off, such that the potential of the pull-up node PU (i.e., the gate of the tenth transistor M10) is pulled to a high potential, the tenth transistor M10 is opened; since the clock blocking signal CLKB here is of low level, the output end of the shift register unit is of low level; the clock signal CLK is of high level, the sixth transistor M6 is turned on; since the output end of the shift register unit here is of low level, the seventh transistor M7 is turned off; if the shift register unit does not comprise the ninth transistor M9, the sixth transistor M6 will pull the gate of the eighth transistor M8, i.e. the pull-down node PD to a high potential (as shown in FIG. 13a), hence, the eighth transistor M8 is turned on; if the shift register unit comprises the ninth transistor M9, although the ninth transistor M9 is turned on when the backward scan trigger signal BSTS is of high level, since the ratio between the size of the sixth transistor M6 and the size of the ninth transistor M9 can make the voltage of the gate of the eighth transistor M8, i.e., the pull-down node PD be of high level when the sixth transistor M6 and the ninth transistor M9 are both turned on (as shown in FIG. 13b), hence the eighth transistor M8 is turned on; thereby enabling the output end OUT of the shift register unit to be connected with the low level signal end VGLIN, the output end OUT of the shift register unit is of low level.

Second Phase: The backward scan trigger signal BSTS is of low level, the fourth transistor M4 is turned off; however, due to the storage function of the first capacitor C1, (due to the storage function of the first capacitor C1 and the second capacitor C2 if the shift register unit further comprises a second capacitor C2), the potential of the pull-up node PU remains high, the tenth transistor M10 is turned on; since the clock blocking signal CLKB here is of high level, the output end OUT of the shift register unit is of high level; moreover, since the enable signal EN is of low level, the third transistor M3 is turned off, hence, under the bootstrap function of the first capacitor C1 (under the bootstrap function of the first capacitor and the second capacitor C2 if the shift register unit further comprises a second capacitor C2), the potential of the pull-up node PU continues to rise on the basis of the first phase; the clock signal CLK is of low level, the sixth transistor M6 is turned off; since the output end OUT of the shift register unit here is of high level, the seventh transistor M7 is turned on; if the shift register unit does not comprise the ninth transistor M9, the seventh transistor M7 will pull the gate of the eighth transistor M8 to a low potential, hence, the eighth transistor M8 is turned off; if the shift register unit comprises the ninth transistor M9, however, the backward scan trigger signal BSTS is of low level in the second phase, hence, the ninth transistor M9 is turned off, the seventh transistor M7 can still pull the gate of the eighth transistor M8, i.e., the pull-down node PD to a low potential, hence, the eighth transistor M8 is turned off; thereby enabling the output end OUT of the shift register unit to be disconnected from the low level signal end VGLIN, so as to ensure the output end OUT of the shift register unit to be of high level.

Third Phase: The enable signal EN is of high level, the third transistor M3 is turned on, hence, the pull-up node PU is connected with the low level signal end VGLIN through the third transistor M3 (if the shift register unit further comprises a fifth transistor M5, the pull-up node PU will be connected with the low level signal end VGLIN through the third transistor M3 and the fifth transistor M5), thereby releasing the high level signal stored on the first capacitor C1 (if the shift register unit comprises a first capacitor C1 and a second capacitor C2, the high level signals stored on the first capacitor C1 and the second capacitor C2 will be released), such that the potential on the pull-up node PU is set to be of low level, the tenth transistor M10 is turned off; moreover, since in the third phase, the clock signal SLK is of high level, the sixth transistor M6 is turned on; if the shift register unit does not comprise the ninth transistor M9, the sixth transistor M6 will pull the gate of the eighth transistor M8, i.e., the pull-down node PD to a high potential; and the parasitic capacitance of the eighth transistor M8 will store the signal of the pull-down node PD, hence, the eighth transistor M8 is turned on; if the shift register unit comprises the ninth transistor M9, however, since in the third phase, the backward scan trigger signal BSTS is of low level, the ninth transistor M9 is turned off, the sixth transistor M6 can still set the voltage of the pull-down node PD to be of high level, hence, the eighth transistor M8 is turned on; thereby enabling the output end OUT of the shift register unit to be connected with the low level signal end VGLIN, the output end OUT of the shift register unit is of low level.

Fourth Phase: The enable signal EN is of high level, the third transistor M3 is turned on, hence, the pull-up node PU is connected with the low level signal end VGLIN through the third transistor M3 (if the shift register unit further comprises a fifth transistor M5, the pull-up node PU will be connected with the low level signal end VGLIN through the third transistor M3 and the fifth transistor M5), the pull-up node PU remains at a low potential; while since in the fourth phase, the clock signal CLK is of low level, the sixth transistor M6 is turned off, if the shift register unit does not comprise the ninth transistor M9, due to the storage function of the parasitic capacitance on the eighth transistor M8, the pull-down node PD remains at a high potential, hence, the eighth transistor M8 is turned on; if the shift register unit comprises the ninth transistor M9; moreover, since in the fourth phase the backward scan trigger signal BSTS is of low level, the ninth transistor M9 is turned off; due to the storage function of the parasitic capacitance on the eighth transistor M8, the pull-down node PD remains at a high potential, hence, the eighth transistor M8 is turned on; thereby enabling the output end OUT of the shift register unit to be connected with the low level signal end VGLIN, the output end OUT of the shift register unit is of low level.

Thereafter, the third phase and the fourth phase are repeated successively until the backward scan trigger signal BSTS received by the shift register unit provided by the embodiments of the present invention is of high level, then the first phase is performed again. Thus in the third phase and the fourth phase, i.e., within the non-working time of the shift register unit provided by the embodiments of the present invention, since the eighth transistor M8 is turned on, the noise at the output end OUT of the shift register unit can be released to the low level signal end VGLIN, thereby reducing the noise in the signal outputted by the shift register unit in the non-working time.

The display panel provided by the embodiments of the present invention comprises a gate driving device provided by Embodiment Seven or Embodiment Eight of the present invention.

The display device provided by the embodiments of the present invention comprises a gate driving device provided by Embodiment Seven or Embodiment Eight of the present invention.

The skilled person in the art can understand that the drawing is only a schematic view of a preferred embodiment, the modules or flows in the drawing are not always necessary for carrying out the present invention.

The skilled person in the art can understand that the modules in the device of the embodiment can be distributed in the device of the embodiment according to the description of the embodiment, and can also make corresponding changes and be located in one or more devices different from the current embodiment. The modules of the above embodiment can be combined into one module, and can also be further divided into a plurality of submodules.

The serial numbers of the above embodiments of the present invention are only for describing rather than being representative of advantages and disadvantages of the embodiments.

Apparently, the skilled person in the art may make various modifications and variations to the present invention without departing from the spirit and scope of the present invention. In this way, provided that these modifications and variations of the present invention belong to the scope of the claims of the present invention and the equivalent technologies thereof, the present invention also intends to cover these modifications and variations.

The invention claimed is:

1. A shift register unit comprising at least a pull-up drive module, a first pull-down drive module, a second pull-down drive module and an output module:

the pull-up drive module being used for outputting a received high level signal to the output module when a received scan trigger signal is of high level;

the output module being used for receiving and storing the signal outputted by the pull-up drive module, and outputting a received clock blocking signal through an output end of the shift register unit when the stored signal is of high level; when the scan trigger signal is of high level, the clock blocking signal being of low level;

the first pull-down drive module being used for connecting the output end of the shift register unit with a low level signal end when a received clock signal is of high level, or when the received clock signal is of low level, and the output end of the shift register unit is of low level; and disconnecting the output end of the shift register unit from the low level signal end when the output end of the shift register unit is of high level; the clock signal being contrary to the clock blocking signal;

the second pull-down drive module being used for outputting a low level signal to the output module when a received enable signal is of high level so as to set the signal stored by the output module to be of low level; when displaying a frame of images, the enable signal being of high level in periods of time other than the period of time when the scan trigger signal is of high level and the period of time when the output end of the shift register unit is of high level.

2. The shift register unit as claimed in claim 1, wherein the shift register unit further comprises a bidirectional scanning module;

the bidirectional scanning module is used for outputting a high level scan trigger signal to the pull-up drive module when a received forward scan signal is of high level and a received forward scan trigger signal is of high level; or outputting a high level scan trigger signal to the pull-up drive module when a received backward scan signal is of high level and a received backward scan trigger signal is of high level.

3. The shift register unit as claimed in claim 2, wherein the bidirectional scanning module comprises a first transistor and a second transistor;

the gate of the first transistor receives a forward scan signal, the first electrode of the first transistor receives a forward scan trigger signal, the first transistor is used for outputting the scan trigger signal through the second electrode of the first transistor under the control of the forward scan signal;

the gate of the second transistor receives a backward scan signal, the first electrode of the second transistor receives a backward scan trigger signal, the second transistor is used for outputting the scan trigger signal through the second electrode of the second transistor under the control of the backward scan signal.

4. The shift register unit as claimed in claim 1, wherein the second pull-down drive module comprises a third transistor;

the gate of the third transistor receives the enable signal, the first electrode of the third transistor is connected with the low level signal end, the third transistor is used for outputting the low level signal through the second electrode of the third transistor under the control of the enable signal.

5. The shift register unit as claimed in claim 1, wherein the pull-up drive module comprises a fourth transistor;

the gate of the fourth transistor receives the scan trigger signal, the first electrode of the fourth transistor receives a high level signal, the fourth transistor is used for outputting the high level signal through the second electrode of the fourth transistor under the control of the scan trigger signal.

6. The shift register unit as claimed in claim 5, wherein the pull-up drive module further comprises a fifth transistor;

the gate of the fifth transistor receives a high level signal, the first electrode of the fifth transistor is connected with the second electrode of the fourth transistor, the fifth transistor is used for outputting the signal on the second electrode of the fourth transistor to the output module through the second electrode of the fifth transistor.

7. The shift register unit as claimed in claim 6, wherein the first pull-down drive module comprises a sixth transistor, a seventh transistor and an eighth transistor;

the gate of the sixth transistor receives the clock signal, the first electrode of the sixth transistor is connected with the gate of the sixth transistor, the second electrode of the sixth transistor is connected with the first electrode of the seventh transistor and the gate of the eighth transistor respectively, the gate of the seventh transistor is connected with the output end of the shift register unit, the second electrode of the seventh transistor receives the low level signal, the first electrode of the eighth transistor is connected with the output end of the shift register unit, the second electrode of the eighth transistor receives the low level signal.

8. The shift register unit as claimed in claim 7, wherein the first pull-down drive module further comprises a ninth transistor;

the gate of the ninth transistor receives the scan trigger signal, the first electrode of the ninth transistor is connected with the second electrode of the sixth transistor, the second electrode of the ninth transistor receives the low level signal; the ratio between the size of the sixth transistor and the size of the ninth transistor is a preset value.

9. The shift register unit as claimed in claim 8, wherein the output module comprises a tenth transistor and a first capacitor;

the gate of the tenth transistor receives the signal outputted by the pull-up drive module and the signal outputted by the second pull-down drive module respectively, the first electrode of the tenth transistor receives the clock blocking signal, the second electrode of the tenth transistor is the output end of the shift register unit;

one end of the first capacitor is connected with the gate of the tenth transistor, the other end of the first capacitor is connected with the output end of the shift register unit.

10. The shift register unit as claimed in claim 9, wherein the output module further comprises a second capacitor;

one end of the second capacitor is connected with the gate of the tenth transistor, the other end of the second capacitor is connected with the low level signal end.

11. A gate driving device, wherein the device comprises multiple stages of shift register unit as claimed in claim 1; except for the first stage of shift register unit, each stage of shift register unit receives a signal outputted by a previous stage of shift register unit of itself as a scan trigger signal; the first stage of shift register unit receives an initial trigger signal as the scan trigger signal.

12. A display panel comprising a gate driving device as claimed in claim 11.

13. A display device comprising a gate driving device as claimed in claim 11.

14. A gate driving device, wherein the device comprises multiple stages of shift register unit as claimed in claim 1; except for the first stage of shift register unit and the last stage of shift register unit, each stage of shift register unit receives a signal outputted by a previous stage of shift register unit of itself as a forward scan trigger signal, and receives a signal outputted by a next stage of shift register unit of itself as a backward scan trigger signal; the first stage of shift register unit receives a first initial trigger signal as the forward scan trigger signal, and receives a signal outputted by a second stage of shift register unit as the backward scan trigger signal; the last stage of shift register unit receives a second initial trigger signal as the backward scan trigger signal, the last stage of shift register unit receives a signal outputted by a previous stage of shift register unit of itself as the forward scan trigger signal.

15. A display panel comprising a gate driving device as claimed in claim 14.

16. A display device comprising a gate driving device as claimed in claim 14.

* * * * *